(12) United States Patent
Moslehi

(10) Patent No.: US 6,488,822 B1
(45) Date of Patent: Dec. 3, 2002

(54) SEGMENTED-TARGET IONIZED PHYSICAL-VAPOR DEPOSITION APPARATUS AND METHOD OF OPERATION

(75) Inventor: Mehrdad M. Moslehi, Los Altos, CA (US)

(73) Assignee: Veecoleve, Inc., Plainview, NY (US)

( * ) Notice: Subject to any disclaimer, the term of this patent is extended or adjusted under 35 U.S.C. 154(b) by 0 days.

(21) Appl. No.: 09/694,046

(22) Filed: Oct. 20, 2000

(51) Int. Cl.[7] .......................... C23C 14/35; C23C 14/34
(52) U.S. Cl. .............................. 204/192.12; 204/298.12; 204/298.08; 204/298.09; 204/298.16
(58) Field of Search ................... 204/192.12, 298.09, 204/298.08, 298.12, 298.16

(56) References Cited

U.S. PATENT DOCUMENTS 4,981,566 A * 1/1991 Wurczinger ............ 204/192.13
6,093,293 A * 7/2000 Haag et al. ............ 204/298.12

2001/0009225 A1 * 7/2001 Leyendecker et al. . 204/298.08

* cited by examiner

*Primary Examiner*—Steven H. VerSteeg
(74) *Attorney, Agent, or Firm*—Gray Cary Ware & Freidenrich, LLP (57) ABSTRACT

A segmented target system and method performs an ionized physical-vapor deposition of a material on a work piece. The system includes an optimal permanent magnet array, vacuum plate, and multiple target segments formed from an electrically conductive material and are coupled to the vacuum plate. The system further includes multiple power sources where each power source couples to at least one of the target segments and where each of the power sources couples to at least one phase shifter forming a multiple inductive source. A circuit couples the power sources and the target to transfer power from the power sources to the target. The interaction of the multiple inductive sources once powered forms an inductively coupled electromagnetic field approximately parallel to the target that increases the ionization of the PVD sputter species, enhances the material density and collimation of deposition on the work piece.

40 Claims, 4 Drawing Sheets

SEGMENTED-TARGET IONIZED PHYSICAL-VAPOR DEPOSITION APPARATUS AND METHOD OF OPERATION

TECHNICAL FIELD OF THE INVENTION

The present invention relates to a method and system for plasma-assisted processing of micro-electronic devices and, more particularly, to a system and method using a segmented-target cathode for performing ionized physical-vapor deposition processes, such as those that are utilized to produce semiconductor data storage, flat-panel display, photovoltaic and other devices used in electronic and information systems.

BACKGROUND OF THE INVENTION

Plasma-assisted physical-vapor deposition (PVD) using various sputtering target materials is commonly used in thin-film fabrication technology for manufacturing of semiconductor, data storage, flat-panel display, and photovoltaic devices. Plasma sputtering is the most important and widely used thin-film deposition fabrication technique. In semiconductor integrated circuit (IC) manufacturing, PVD processes are used to deposit contact/via barrier (e.g., TiN or TaN) and glue (e.g., Ti) layers as well as metallization materials (e.g., Al or Cu). State-of-the-art semiconductor technologies for producing high-performance logic devices such as microprocessor chips employ four to six levels of metal interconnects. Current salicided CMOS technologies with four levels of interconnects may use (a) one PVD step (e.g., Ti deposition) to form self-aligned silicide (i.e., salicide), (b) two PVD steps to deposit Ti and TiN layers at the contact level, (c) one PVD step to deposit the first level of interconnect (typically Al, plus 1% Si, and 0.5% Cu), (d) one PVD step to deposit an anti-reflection coating (ARC) layer to facilitate the interconnect patterning process, and (e) up to nine additional PVD process steps to form the three additional interconnect levels and associated via liner and barrier layers, as well as ARC layers. This process description illustrates that advanced semiconductor IC manufacturing technologies with multiple levels of interconnect can often require numerous PVD process steps, some with stringent step coverage and bottom coverage requirements in order to produce continuous coverage over high-aspect ratio contact and via structures.

The performance, reliability, and yield of the multilevel interconnects strongly influence the reliability and manufacturing yield of semiconductor chips, such as high-performance microprocessors. As a result, PVD fabrication processes play a significant role in semiconductor integrated circuits, since they influence all significant multilevel interconnect performance and reliability parameters.

Existing commercial PVD technologies usually employ DC or RF or pulsed DC (AC) magnetron sputtering in vacuum processing chambers. A typical commercial PVD module includes a single-substrate (single-wafer) vacuum process chamber (preferably designed as a cluster tool module), a temperature-controlled (with an option to apply biased electrical power) chuck to hold the substrate, and a sputter target (or magnetron cathode) that contains the desired material. DC (or pulsed DC) magnetron plasma excitation (with DC power levels up to 20 kW and higher) is usually used for sputter deposition of electrically conductive materials such as Al, Ti, Co and TiN. RF magnetron (or pulsed DC) sputtering is usually used for sputter deposition of electrically insulating (or resistive) materials. RF diode sputtering (as opposed to magnetron PVD sputtering) is the preferred choice for sputter deposition of some magnetic and insulating materials for applications such as thin-film head fabrication.

Each of these PVD methods generates a plasma from an inert plasma gas an sustains the plasma near the target area. The target material atoms or molecules are then sputtered from the target surface and a fraction of them is deposited on the device substrate. Sputter etching of the target surface occurs due to energetic argon ion or another suitable ionized gas (such as xenon) species. During the sputtering process, the sputtered species (mostly neutrals) are emitted within the vacuum chamber plasma environment over a wide range of spatial angles and a portion of the sputtered flux deposits on the device substrate. Other sputtering processes, such as reactive sputtering processes, use nitrogen or oxygen or another reactive gas, instead of, or in addition to, an inert gas within the vacuum processing chamber. Reactive magnetron sputtering processes that, deposit TiN layers from elemental Ti targets illustrate an example of this technique.

In general, the flux of the sputter atoms or species that the PVD target material emits has a relatively broad angular distribution. Similarly, the sputter flux of species arriving at the substrate surface has a relatively broad spatial distribution angle. This broad spatial distribution angle does not usually present a problem in applications involving substrates without high-aspect-ratio features.

However, some semiconductor device manufacturing applications involve substrates with high-aspect-ratio features. These applications require some degree of spatial filtering or collimation for the sputter species. A broad angular distribution of the PVD flux implies poor collimation or a low degree of collimation, whereas a narrow angular distribution relative to the perpendicular axis indicates a higher degree of PVD collimation. For instance, semiconductor interconnect applications require collimated sputtering for deposition of the contact and via liner/glue and barrier layers (e.g. Ti/TiN) when using high-aspect-ratio (e.g., on the order of ≧3:1) contacts and vias due to the bottom and sidewall coverage requirements. For a contact/via hole of width (or diameter) W and height H, the following parameters can be defined:

$$A.R. \triangleq \frac{H}{W} \text{ (aspect ratio)}$$

$$\text{Bottom Coverage} \triangleq \frac{t_b}{d}$$

$$\text{Sidewall Coverage} \triangleq \frac{t_s}{d} \text{ (step coverage)}$$

where d is the thickness of sputtered material layer on extended flat top surfaces, $t_b$ is the sputtered material thickness at the bottom of the hole, and $t_s$ is the thickness of the sputtered material on the hole sidewall at mid height.

In conventional PVD processes without any built-in sputtering-collimation feature, the bottom coverage and sidewall coverage of the sputter deposited material degrades significantly as the microstructure aspect ratio increases. This degradation becomes increasingly worse for microstructure aspect ratios of greater than ~3:1. As a result, for applications requiring good (e.g., ≧25%) bottom coverage and sidewall coverage (e.g., ≧50%), existing PVD technologies use a collimator plate placed between the PVD target or cathode assembly and the substrate inside the vacuum chamber.

The collimator plate, usually made of aluminum or titanium, consists of an array of circular or hexagonal closely packed holes that typically have an aspect ratio of 1:1 or higher. The collimator plate operates as a spatial filter to reduce the angular distribution of the sputter flux species arriving at the substrate. The degree of collimation increases (thus decreasing the angular distribution of the sputter flux species at the substrate) as the collimator plate hole aspect ratio increases. Although physical collimation via a fixed collimator plate is extensively practiced in commercial PVD processes for semiconductor contact/via glue/liner and barrier deposition, it has a number of disadvantages.

First of all, a trade off exists between the sputter deposition rate (throughput) and the degree of collimation. In other words, higher degrees of collimation require collimators with higher aspect ratios resulting in a reduced deposition rate on the substrate. This trade-off in physically collimated PVD systems presents a significant throughput limitation. Secondly, the collimator becomes gradually coated with the sputtering material. This can result in particulate generation within the PVD vacuum chamber. Moreover, the coating creates a non-uniform blockage of the collimator holes that can result in long-term drift of the process uniformity. These problems lead to frequent removal and cleaning of the collimator plate. The need for frequent cleaning and maintenance of the collimator has a negative impact on the overall process uptime and product throughput. Finally, a fixed collimator plate does not allow for variable (i.e., adjustable in real-time) and controlled degrees of collimation, since the degree of collimation is fixed by the aspect ratio of the collimator. Some processes require multi-step depositions with and without PVD collimation in order to maximize the process throughput while, at the same time, establishing optimal hole or trench filling capability. These processes must use multiple PVD chambers (including PVD chambers or modules with collimation and those without collimation) on a cluster tool which results in an increased cost-of-ownership.

Another prior art PVD collimation method is the so-called "natural collimation" or "long-through" collimation method. The natural collimation method relies on providing a relatively large spacing (as compared to substrate diameter) between the target and the substrate in a low-pressure (e.g., below 1 m torr) process ambient. In this collimation technique, higher collimation ratios require larger target-to-substrate spacing values and significantly reduced PVD pressures. Like the physical collimation method with a collimator plate, the natural collimation technique also suffers from a trade-off between the degree of collimation and the deposition rate. Moreover, a higher collimation ratio in a natural collimation method results in a higher PVD chamber volume and demands reduced processing pressures to reduce scattering, requiring a higher pumping speed pump package.

Thus, there is a need for an ultraclean PVD collimation technique which does not generate particulates and does not require regular and frequent replacement or cleaning of the PVD chamber components.

Moreover, there is a need for an improved PVD collimation that does not suffer from a trade-off between the deposition rate and the degree of PVD collimation.

There is also a need for an improved collimation technique which provides a capability for adjustable and controlled collimation (programmable electrical collimation) of the PVD process in real time. The collimation control capability will be established via a controlled and adjustable electrical parameter (substrate bias, ionization source RF power, or both of these parameters) with or without a capability to adjust the target-to-substrate spacing.

There is also a need for a PVD technology that can perform high-throughput processing of substrate using high rate deposition with enhanced processing capability without requiring higher PVD chamber volume.

There is also a need for a PVD technology that can deposit material layers with excellent thickness control and process control capability for a wide range of material layer thicknesses from very thin (e.g., down to 10Å) to relatively thick layers.

SUMMARY OF THE INVENTION

The present invention provides an apparatus and method for processing a semiconductor device using a segmented target assembly in a physical-vapor deposition (PVD) process module that substantially eliminates or reduces disadvantages and problems associated with previously developed techniques for performing PVD processes.

More specifically, the present invention provides a segmented target system and method for performing ionized physical-vapor deposition of a material on a work piece. The segmented target system includes a permanent magnet array (or electromagnets), a vacuum plate, and a target having a plurality of target segments formed from an electrically conductive material. The plurality of target segments are coupled to the vacuum plate. The system further includes a plurality of power sources (or a single power source with a plurality of distribution branches) where each power source or distribution branch couples to at least one of the target segments and where each of the power sources (or distribution branches) couples to at least one phase shifter to form a plurality of inductive sources when power is applied. A circuit couples to both the power sources and the target to transfer power from the power sources to the target. Upon powering the power sources, the interaction of the plurality of inductive source forms an inductively coupled magnetic field approximately parallel to the target that increases the ionization of the PVD sputter species and enhances the material density and uniformity of deposition on the work piece.

The present invention provides an important technical advantage by providing an improved PVD collimation that does not suffer from a serious trade-off between the deposition rate and the degree of PVD collimation.

Another technical advantage of the present invention is that it provides an ultraclean PVD process technique that eliminates or greatly reduces particulate generation due to collimation and does not require regular and frequent replacement or cleaning of a physical collimator (due to lack of a need for a physical collimator).

The present invention provides another technical advantage by providing the capability to adjust and control the degree of collimation (programmable electrical collimation) of the PVD process in real time. The present invention can implement variable collimation via a controlled and adjustable electrical parameter (substrate bias, ionization source RF power, or both of these parameters).

The present invention provides another technical advantage by performing high throughput processing of substrate using high-rate deposition with enhanced processing capability that does not require an increased volume PVD chamber.

A further technical advantage of the present invention is the capability to provide a highly repeatable PVD process for deposition of ultrathin (e.g., down to 5–20Å) layers by ICP-assisted generation of a stable plasma, allowing the use of very low or reduced electrical power levels on the PVD cathode.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGURES like numerals being used to refer to like and corresponding parts of the various drawings.

The present invention involves an improved PVD process for depositing a material on a work piece (typically a substrate or wafer) in semiconductor and related manufacturing processes. In the present invention, the PVD target itself is segmented and partitioned in order to form a multi-zone inductively-coupled plasma (ICP) ionization source in the target region. Forming the PVD target from an electrically conductive material allows using the STI-PVD (STI: Segmented Target Ionized) technique with various PVD energy sources (including DC magnetron, RF magnetron, RF diode, and DC diode sources). Since semiconductor PVD applications typically use DC magnetron PVD for sputtering processes, the discussion here will focus on the STI-PVD technique in conjunction with DC magnetron sputtering. However, similar design and considerations will also be applicable to other PVD energy sources as well.

Figure 1:
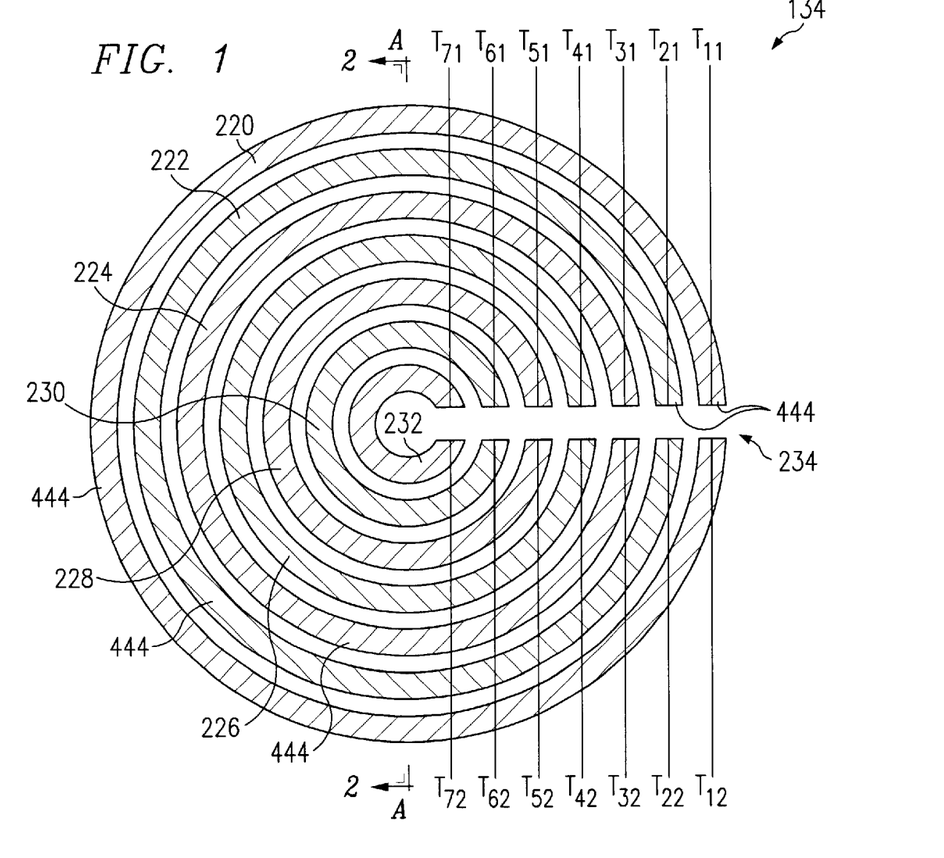
FIG. 1 shows a segmented PVD target configuration of the present embodiment.

FIG. 1 shows a bottom view of one embodiment of the segmented ionized PVD target 134 of the present invention. The embodiment of FIG. 1 includes seven target segments including the first target segment 220, second target segment 222, third target segment 224, fourth target segment 226, fifth target segment 228, sixth target segment 230, and seventh target segment 232. Each target segment terminates and begins at space 234. In particular, the first target segment 220 begins at electrical terminal $T_{11}$ and ends at electrical terminal $T_{12}$; the second target segment begins at electrical terminal $T_{21}$ and ends at electrical terminal $T_{22}$; the third target segment begins at electrical terminal $T_{31}$ and ends at electrical terminal $T_{32}$; the fourth target segment begins at electrical terminal $T_{41}$ and ends at electrical terminal $T_{42}$; the fifth target segment begins at electrical terminal $T_{51}$ and ends at electrical terminal $T_{52}$; the sixth target segment begins at electrical terminal $T_{61}$ and ends at electrical terminal $T_{62}$; and the seventh target segment begins at electrical terminal $T_{71}$ and ends at electrical terminal $T_{72}$. Terminals $T_{11}$, $T_{21}$, $T_{31}$, $T_{41}$, $T_{51}$, $T_{61}$, and $T_{71}$, are linking terminals connect to RF suppression and DC link circuits. Terminals $T_{12}$, $T_{22}$, $T_{32}$, $T_{42}$, $T_{52}$, $T_{62}$, and $T_{72}$ are power terminals that can link to power sources.

Figure 2:
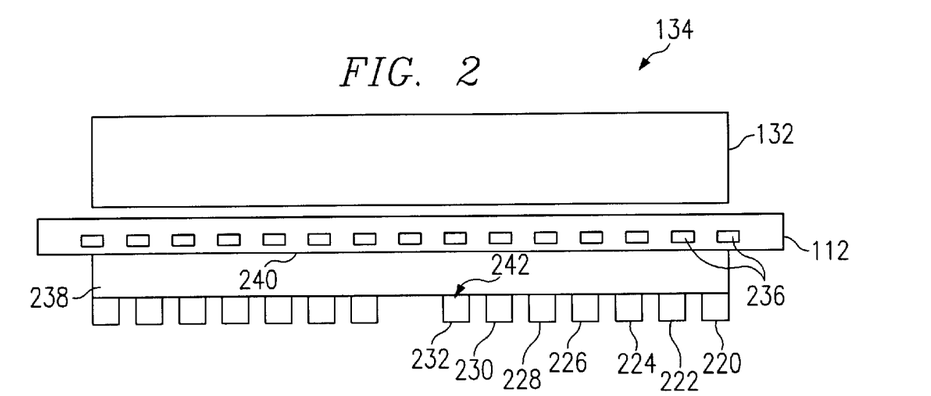
FIG. 2 illustrates a side cut-away view of the device of FIG. 1.

FIG. 2 shows a side cross sectional view of the segmented PVD target 134 along cross sectional line A—A of FIG. 1. Target 134 includes permanent magnet array 132 for magnetron PVD that associates with top vacuum plate 112 of the process chamber (not shown). Top vacuum plate 112 includes numerous cooling channels 236 with multiple electrical feedthroughs associated with the target turns described in FIG. 1. Top vacuum plate 112 bonds via a bonded metal-to-ceramic interface 240 to bonded ceramic plate 238. Target segments 220, 222, 224, 226, 228, 230, and 232 bond to bonded plate 238 opposite top vacuum plate 112. Moreover, each of the target turns 220 through 232 includes a target-to-ceramic bonded interface 242.

Figure 3:
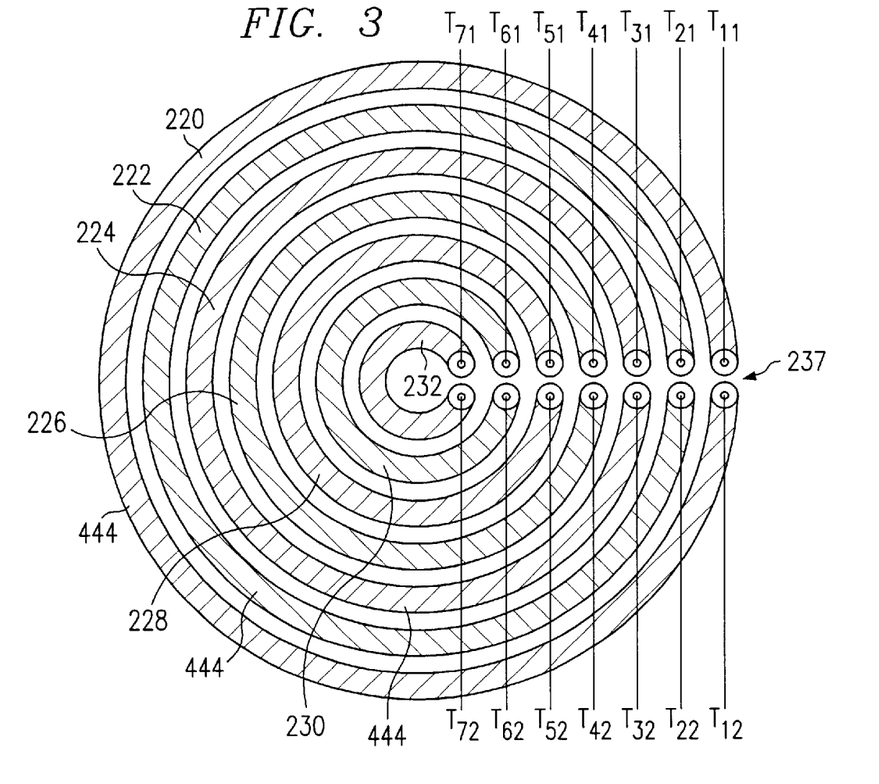
FIG. 3 depicts the electrical connection feedthroughs for the device of FIG. 1.

FIG. 3 shows the segmented target ionized PVD electrical feedthroughs that go through top vacuum plate 112 of FIG. 2. In FIG. 3, a top view image of various target segments appear as broken rings 220, 222, 224, 226, 228, 230, and 232. The UHV RF, feedthroughs form seven pairs of electrical feedthroughs for the seven target segments of FIG. 3. In particular, terminals T11 and T12 each connect to one end of target 220. Terminals T21 and T22 each connect to one end of target 222. Terminals T31 and T32 each connect to one end of target 224. Terminals T41 and T42 each connect to one end of target 226. Terminals T51 and T52 each connect to one end of target 228. Terminals T61 and T62 each connect to one end of target 230. Terminals T71 and T72 each connect to one end of target 232.

The STI-PVD target design of the present invention employs seven (or any other number N≧2)isolated broken segment rings made of an electrically conductive material (for example Ti for Ti/TiN deposition). The number of target segments, however, may be as few as two and as many as eight or more, depending on the size of the substrate and total diameter of the cathode. The present invention describes a seven-segmented target 134 for processing 200-mm wafers. Typically, for 200-mm wafer processing, the outside diameter of the target/cathode 134 approximates 300 mm and the number of segments in the target ranges from three to eight. As shown on FIG. 1, the target segments 444 contain seven pairs of electrical terminals ($T_{11}$ and $T_{12}$ for outer segment 1 through $T_{71}$ and $T_{72}$ for the inner segment 7).

As shown on FIG. 2, the target segments of the STI-PVD cathode 134 connect to a thermally conducting and electrically insulating plate 238, preferably made of AlN, using a hermetically sealed bonding process. A low-temperature bonding process using a suitable bonding material (such as indium or tin) provides an acceptable bond. The thermally conducting bonding substrate (AlN or BN) includes seven pairs of feedthrough holes aligned with the target segments in order to make external electrical contacts to the target segments. These electrical feedthroughs can comprise UHV-grade RF and DC feedthroughs as shown in the top-view diagram of the STI-PVD cathode 134 on FIG. 3. For 200-mm wafer processing, the AlN plate 238 can be a 300-mm diameter disk. The thickness of the AlN plate 238 can range from 0.125" to 0.50" depending on the PVD cathode design and process parameters. The AlN plate 238 should be thin enough in order to allow effective cooling of the target segments (e.g., to less than 150° C.) at the highest DC magnetron PVD power level (e.g., 20 kW), using the water-cooled stainless steel or copper vacuum plate 112.

FIG. 2 shows the AlN plate 238 bonded to the water-cooled stainless steel or copper vacuum plate 112 using a hermetic bonding/sealing process. Again, this bonding can be performed using a low-temperature bonding material such as indium or tin, or a medium-temperature bonding material such as aluminum. Preferably, the AlN plate 238 stainless steel or copper vacuum plate 112 bonding process uses a higher temperature bonding process than the one used for bonding of the target segments to the AlN plate 238. This allows easier change of target 134 by making the combination of the water-cooled stainless steel or copper vacuum plate 112 and AlN plate 238 a reusable assembly.

As consumption of the target segments progresses over multiple PVD runs, the STI-PVD cathode assembly 134 can be removed before complete consumption of the target segments when relatively thin layers of the target segments still exist over the AlN plate 238. The STI-PVD cathode assembly 134 can then be heated to a relatively low temperature (approximately 300° C. when indium or an indium alloy used for bonding of the target segments) to de-bond or detach the thin target segments from the AlN plate 238. This low temperature thermal de-bonding process, however, should not detach the AlN plate from 238 the stainless steel or copper cathode vacuum plate 112 if a higher temperature bonding process and material (such as Al or Al alloy) has been used to attach AlN plate 238 to the vacuum plate 112. This combination of bonding processes will eliminate the need for repeated bonding of the AlN plate 238 to the vacuum plate 112 during target segment changes. After thermal de-bonding (or chemically etching with a selective etch process), the new target segments are attached to AlN plate 238 surface using a low-temperature bonding process. This strategy allows repeated use of a single STI-PVD cathode assembly 134 over many target segment changes.

The use of bonded interfaces for connecting the target/AlN/vacuum plate stack 134 not only enables effective cooling of the target segments during PVD process, but also provides a UHV-grade PVD cathode 134 design with only one vacuum seal between the STI-PVD cathode and the PVD vacuum chamber 136 (metal seal or differentially pumped elastomer ring seals).

The hermetic seal between the AlN plate 238 and the STI-PVD vacuum plate 112 may also be made using a thermal fusing process between two different materials. One such process involves sputter depositing a thin layer of Si (approximately 1 μm or thicker) on one side of the AlN plate 238. A layer (on the order of a few thousand angstroms) of a refractory metal such as titanium is then sputter deposited on the vacuum plate 112. Mechanically clamping and heating the stainless steel vacuum plate 112 and AlN plate 238 will fuse the plates together by forming a titanium silicide at the vacuum plate/AlN interface.

Figure 4:
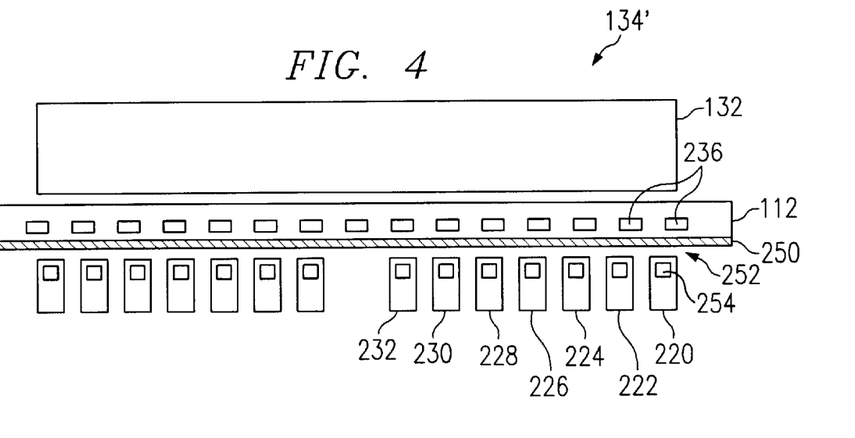
FIG. 4 illustrates a side cut-away view of an alternative embodiment the device of FIG. 1.

FIG. 4 shows an alternative embodiment of the segmented target design 134 (with seven segments) that excludes ceramic plate 238 as it appears in segmented ionized PVD target 134 of FIG. 2. In alternative segmented target 134, permanent magnet array 132 is positioned above top vacuum plate 112 including cooling water channels 236. Protective insulating shield 250 bonds to top vacuum plate 112. Target turn 220, 222 224, 226, 228, 230 and 232 are positioned below protective insulating shield 250 and separated by a free space gap 252. Freestanding target segments 220 through 232 include internal water cooling channels 254 supported by tubular feedthroughs that penetrate top vacuum plate 112.

In the design of FIG. 4, each STI-PVD segment is again a broken ring. However, each ring segment is made of a tubing of the desired material such as copper, aluminum or titanium. Moreover, each STI-PVD ring segment directly connects to a pair of tubing sections connected to the UHV RF feedthroughs. Cooling water flowing through the feedthroughs and within the segment can directly cool each STI-PVD segment. The preferred STI-PVD design, however, includes the AlN plate 238 for target loading since it allows easier target 134 replacement and cooling.

A simple thermal analysis performed on the AlN plate 238 thickness will analyze effective target cooling. AlN has a thermal conductivity of 170 W/mk and a dielectric constant of 8.6. The thermal expansion coefficient of AlN is $4.7 \times 10^{-6}/$° C. Neglecting the thermal contact resistance of the bonded interfaces between the target segments and AlN and between AlN and the vacuum plate, the maximum allowable AlN plate 238 thickness for $T_{max}=125$° C. on the target 134 can be calculated. Assuming a water-cooled stainless steel vacuum plate 112 temperature of 25° C. and a maximum thermal dissipation of 10 kW into the target, the following formula applies:

$$P/A = \frac{\Delta T}{R}$$

where P is the maximum thermal dissipation into the target 134, A is the cathode area (12" diameter), ΔT is the temperature rise of AlN plate 238, and R is the thermal resistance. The calculation goes as follows:

$$\frac{10 \times 10_3 W}{\frac{\pi}{4}(12 \times 2.5)_2^{cm2}} = \frac{125° - 25°k}{\left(\frac{t}{170 \text{ w/mk} \times 0.01 \text{ m/cm}}\right)}$$

$$\frac{4 \times 10_4}{\pi \times 900} \text{ w/cm}_2 = \frac{1.7 \times 100 \text{ w/cm}}{t}$$

$$t = \frac{\pi \times 900 \times 1.7 \times 100}{4 \times 10^4} \cong 12 \text{ cm}$$

Where t is the thickness of the AlN plate 238.

Therefore, the thermal conductivity of AlN can effectively allow for target 134 cooling using the water-cooled stainless steel vacuum plate 112. The AlN plate 238 thickness should be thin enough to allow effective magnetic field penetration through the target/AlN/vacuum plate stack 134 for magnetron PVD. On the other hand, the AlN plate thickness should be large enough to minimize RF power losses into the stainless steel plate 112 and maximize the ICP power coupling efficiency to the PVD plasma environment. The typical AlN plate 238 thickness can range from 0.125" to 0.50", with thinner AlN plates 238 for a magnetron made of PVD. Inserting a high-μ soft magnetic material plate (or multiple radial rods) between the AlN plate 238 and the stainless steel vacuum plate 112 will reduce the RF losses into the stainless steel vacuum plate 112. This permeable magnetic plate (for instance, made of nickel) short circuits the magnetic field lines penetrated within the AlN plate 238 before they reach the stainless steel or copper vacuum plate. The magnetic plate (or radial bars) should be bonded as part of the target/AlN/magnetic plate/vacuum plate stack 134. This high-μ plate may be ¹⁄₃₂" to ⅛" thick and should be preferably made of a soft magnetic material with relatively high electrical resistivity.

A typical PVD process chamber for 200 to 300 mm water processing may have an 18" inner diameter. The stainless steel vacuum plate 112 may be approximately 20" in diameter. The 20" diameter vacuum plate can support a 12" cathode 134 and provides a vacuum seal at the top of the PVD process chamber. The stainless steel vacuum plate 112, as shown in FIG. 2, includes water cooling channels 236 for effectively cooling the segmented PVD target 134 across the AlN plate 238. Moreover, the stainless steel vacuum plate 112 provides a series of RF feedthroughs (14 UHV RF feedthroughs for STI-PVD cathode with 7 broken rings) that provide electrical connections to the terminals of the target segments 444. The STI-PVD target segments 444 can be partitioned externally to operate as either a single-zone or as a multi-zone inductively coupled plasma (ICP) ionization source. A multi-zone ICP ionization source represents a preferred configuration for uniformity control.

Figure 5:
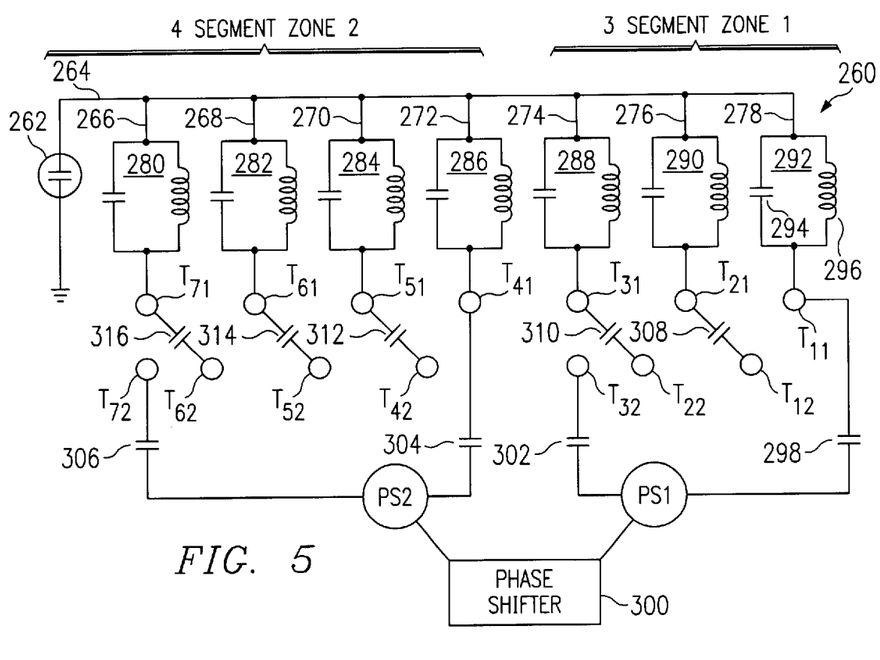
FIG. 5 describes a two-zone electrical connection scheme for the device of FIG. 1.

FIG. 5 shows a schematic electrical diagram 260 an embodiment of the STI-PVD, cathode 134 connections compatible with a 2-zone ICP ionization source configuration. In two-zone electrical circuit 260 of FIG. 5, DC power supply 262 provides DC power for seven target segments 444 along line 264. Parallel connections 266, 268, 270, 272, 274, 276, and 278 connect to RF suppression filter/DC links 280, 282, 284, 286, 288, 290, and 292 respectively. Each RF suppression filter/DC link includes a parallel inductor capacitor resonator circuit that includes, for example, capacitor 294 and inductor 296. RF suppression filter/DC link circuit 292 connects to terminal $T_{11}$ which corresponds with outer target 220 of FIG. 1. DC blocking capacitor 298 connects between terminal $T_{11}$ and RF power supply PS1. RF power supply PS1 connects to phase shifter 300 and DC blocking capacitor 302. Capacitor 302 connects between power supply PS1 and terminal $T_{32}$ of target turn 224 of FIG. 1. Power supply PS2 also connects to phase shifter 300. Power supply PS2 further connects to DC blocking capacitors 304 and 306. Capacitor 304 connects between terminal $T_{41}$ and PS2. Terminal $T_{41}$ (corresponding to target segment 226 of FIG. 1) connects to RF suppression filter/DC link circuit 286. Capacitor 306 connects between power supply PS1 and terminal $T_{72}$ (coupled to target segment 232).

In the remainder of the circuit, RF suppression filter/DC link 290 connects to terminal $T_{21}$, which couples to terminal $T_{12}$ through capacitor 308. RF suppression filter/DC link circuit 288 connects to terminal $T_{31}$, which couples to terminal $T_{22}$ through capacitor 310. RF suppression filter/DC link circuit 284 connects to terminal $T_{51}$, which couples to terminal $T_{42}$ through capacitor 312. RF suppression filter/DC link circuit 282 connects to terminal $T_{61}$, which couples to terminal $T_{52}$ through capacitor 314. RF suppression filter/DC link circuit 280 connects to terminal $T_{71}$, which couples to terminal $T_{62}$ through capacitor 316.

FIG. 5 represents a DC magnetron PVD configuration with a 2-zone ICP ionization source where, with reference to FIG. 1, the outer three target segments (220, 222, and 224) form the first ICP ionization zone (Zone 1) and the inner four target segments (226, 228, 230, and 232) form the second ICP ionization zone (Zone 2). These two ICP ionization zones are powered by two in-phase RF power supplies (PS1 and PS2) using a phase shifter 300. External RF capacitors are used to connect the adjacent segments within each ICP ionization zone as shown in FIG. 5. For instance, Zone 1 is formed by connecting $T_{31}$ to $T_{22}$ using external capacitor 310, and connecting $T_{21}$ to $T_{12}$ using external capacitor 308. The first RF power supply PS1 (13.56 MHz or other operable RF frequency) connects to terminals $T_{11}$ and $T_{32}$ via blocking capacitors 302 and 298 and an RF matching network (not shown). The second RF power supply PS2 connects between $T_{72}$ and $T_{41}$ via DC blocking capacitors 306 and 304. In FIG. 5, Zone 1 includes target segments 220, 222, and 224. Zone 2 consists of the inner four target segments 226, 228, 230, and 232 interconnected by three external RF capacitors ($T_{71}$ to $T_{62}$ via capacitor 316; $T_{61}$ to $T_{52}$ via capacitor 314; and $T_{51}$ to $T_{42}$ via capacitor 312). The interconnections of FIG. 5 illustrate that the outer zone (Zone 1) contains target segments 220, 222, and 224 connected in series via voltage-reduction capacitors 308 and 310. The inner zone (Zone 2) consists of target segments 226, 228, 230, and 232 connected in series via voltage-reduction capacitors 312, 314 and 316.

All target segments connect to the DC magnetron DC power supply 262 via RF blocking filters (shown as resonant "LC" circuits). RF power supplies PS1 and PS2 of FIG. 5 may deliver up to 2 kW each to the ICP ionization zones, though higher maximum RF power levels can be used. Although the design presented here shows three segments in Zone 1 and four segments in Zone 2, a two-zone configuration may use various other external partitioning arrangements (e.g., two segments in Zone 1 and five segments in Zone 2). Moreover, the target/cathode 134 can connect to an electrical supply with more than two STI-PVD ICP ionizationes (for instance three-zone or four-zone arrangements using three or four RF power supplies, respectively) by rearranging the external capacitors. As a result, a given source design can be externally reconfigured to operate for a 1-zone, 2-zone, 3-zone, or in general N-zone segmented target ICP source. Moreover, for any selected number of ICP. zones, the target segments can be externally wired with various partitioning arrangements. For instance, for the same seven-segment target design shown on FIGS. 1 through 3, the STI-PVD source can be externally wired for three-zone ICP configuration as shown in the schematic wiring diagram on FIG. 6.

Figure 6:
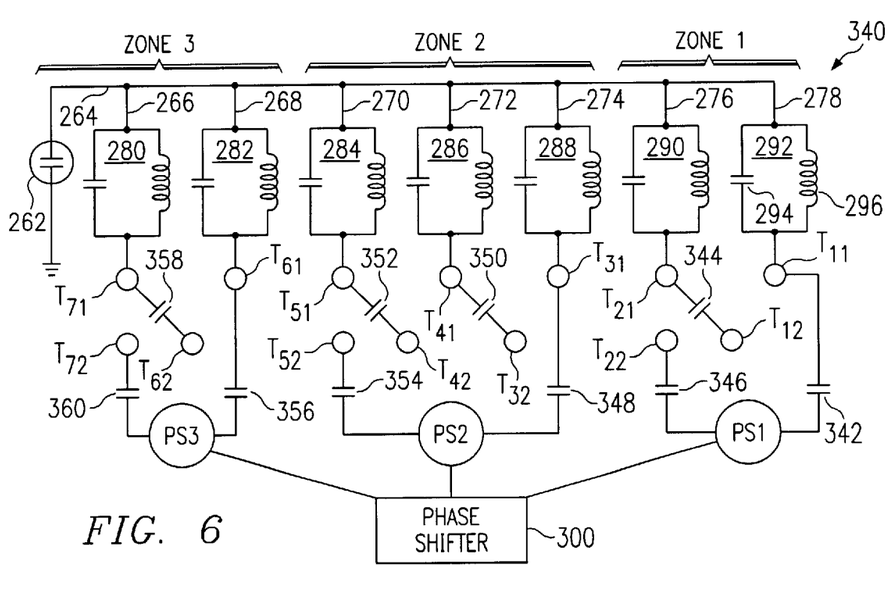
FIG. 6 shows a three-zone electrical connection scheme for an embodiment of the device of FIG. 1.

FIG. 6 shows a three-zone electrical circuit 340 for the segmented target 134 according to the present embodiment. FIG. 6, viewed in conjunction with FIG. 1, shows that the outer zone (Zone 1) is made of segments 220 and 222 (connected via series capacitor 344); the middle zone (Zone 2) is made of segments 224, 226, and 228 (connected via series voltage reduction capacitors 350 and 352), and the inner zone (Zone 3) is made of segments 230 and 232 (connected via series voltage-reduction capacitor 358). This three-zone configuration uses three power supplies (PS1, PS2 and PS3) coupled to one or two phase shifters 300 for real-time multi-zone ionization and plasma uniformity control. Other segment partitioning arrangements are also possible besides the one shown on FIG. 6 for three-zone ionized PVD operation.

In three-zone electrical circuit 340, DC power supply 262 provides DC-power for the seven target segments along line 264. Parallel connections 266, 268, 270, 272, 276 and 278 connect to RF suppression filter/DC links 280, 282, 284, 286, 288, 290, and 292 respectively. Each RF suppression filter/DC link includes a parallel inductor capacitor resonator circuit that includes, for example, capacitor 294 and inductor 296. Terminal $T_{11}$ connects to RF suppression filter/DC link-Circuit 292. Terminal $T_{11}$ further couples to power supply PS1 via capacitor 342 to establish a first connection in Zone 1 of three-zone electrical circuit 340. Referring to FIG. 1 for the target turn connections between the T terminals of FIG. 6 permits an understanding of three-zone electrical connection circuit 340. With reference to both FIGS. 1 and 6, terminal $T_{11}$ connects via target turn 220 to terminal $T_{12}$. Capacitor 344 couples terminal $T_{12}$ with terminal $T_{21}$. Terminal $T_{21}$ connects to RF suppression filter/DC link circuit 290. Also, terminal $T_{21}$ connects through target turn 222 to terminal $T_{22}$. Terminal $T_{22}$ couples with power supply PS1 through capacitor 346.

Zone 2 in three-zone electrical connection circuit 340 includes terminal $T_{31}$ which connects to RF suppression filter/DC circuit 288 and power supply PS2 via blocking capacitor 348. Terminal $T_{31}$ connects to terminal $T_{32}$ via target turn 224 (shown on FIG. 1). Terminal $T_{32}$ couples with terminal $T_{41}$ via capacitor 350 and connects to RF suppression filter/DC link circuit 286. Through target turn 226, terminal $T_{41}$ connects to terminal $T_{42}$. Terminal $T_{42}$ couples with terminal $T_{51}$ via capacitor 352 and connects to RF suppression filter/DC link circuit 284. Through target turn 228, terminal $T_{51}$ couples with $T_{52}$. Terminal $T_{52}$ couples to power supply PS2 through capacitor 354.

Zone 3 of the three-zone electrical connection circuit 340 includes terminal $T_{61}$ which connects to RF suppression filter/DC link circuit 282 and which couples to power supply PS3 via capacitor 356. Target segment 230 connects terminal $T_{61}$ with terminal $T_{62}$. Coupling capacity 358 couples terminal T61 with terminal T71. Terminal T71 connects to RF suppression filter/DC link circuit 280 and connects to terminal $T_{72}$ via target turn 232. Terminal $T_{72}$ couples with power supply PS3 via capacitor 360.

In order to determine the optimum two-zone (or any N-zone with N≧2) segmented target ICP configuration for providing maximum ionization uniformity control, a series of ionized PVD runs can be performed using various two-zone (or N-zone) partitioning configurations according to a matrix of Design-of-Experiments (DOE). The optimum configuration for the widest process window for uniform ionized PVD can then be established via external wiring of the RF feedthroughs.

Figure 7:
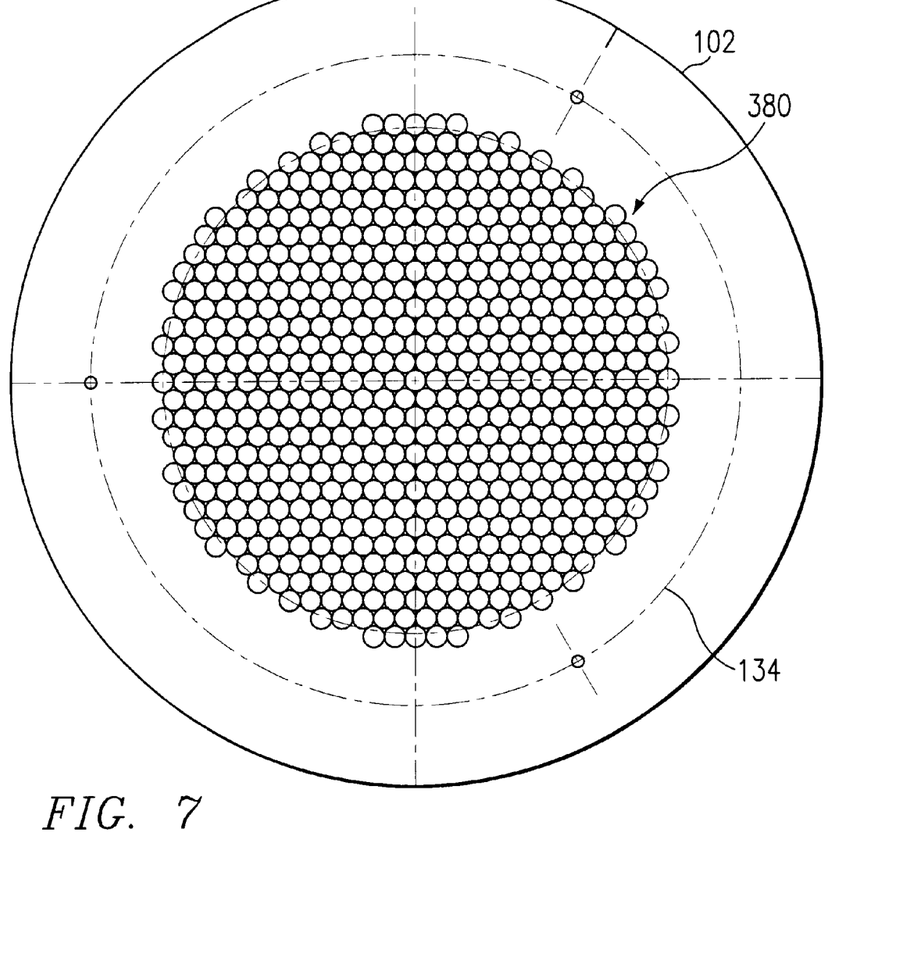
FIGS. 7 and 8 describe a PVD physical collimator device for use in conjunction with the present invention.
Figure 8:
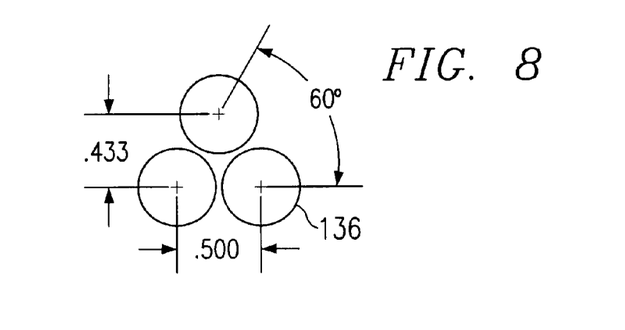

FIG. 7 shows a PVD collimator that may be used with the present invention. Collimator 380 includes numerous cooling channels 374, in vacuum plate 372, for collimating the plasma within the process chamber. FIG. 8 shows the collimator passageway 136 and its configuration for collimating the ions that reach the semiconductor wafer.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed.

What is claimed is:

1. A segmented-target physical-vapor deposition system for ionized physical-vapor deposition of a material onto a work piece, comprising:
   a process chamber;
   a vacuum plate;
   a target, said target further comprising a plurality of target segments coupled to the vacuum plate, the plurality of target segments formed from an electrically conductive material;
   a plurality of power sources, each of the power sources coupled to at least one of the plurality of target segments, thereby forming a plurality of inductive sources when power is applied to the plurality of power sources;
   a circuit coupled to the plurality of power sources and further coupled to the target, the circuit operable to transfer power from the plurality of power sources to the target;
   wherein, upon powering the plurality of power sources, the interaction of the plurality of inductive source forms an inductively coupled magnetic field that increases the ionization of the PVD sputter.

2. The system of claim 1, further comprising a permanent magnet array disposed within the process chamber.

3. The system of claim 1, wherein the plurality of power sources are coupled to at least one phase shifter.

4. The system of claim 1, wherein the inductively coupled magnetic field is approximately parallel to the target.

5. The system of claim 1, further comprising;
   a plurality of feedthroughs formed within the vacuum plate, a first end of each feedthrough in communication with one of the plurality of target segments;
   a terminal coupled to each of the plurality of target segments, each terminal located adjacent to the first end of one of the plurality of feedthroughs, and wherein the terminals are operable to transport power to the plurality of target segments.

6. The system of claim 1, wherein the vacuum plate further comprises a plurality of cooling channels operable to flow a coolant to control temperature during operation.

7. The system of claim 1, wherein the plurality of target segments are broken rings with a first end terminating near a second end.

8. The system of claim 7, further comprising:
   a linking terminal coupled to each first end of the plurality of target segments the linking terminal located adjacent to the first end of one of a plurality of the linking terminal is further coupled to an RF suppression circuit; and
   a power terminal coupled to each second end of the plurality of target segments the power terminal coupled to each of the plurality of target segments, the power terminal located adjacent to the second end of one of the plurality of feedthroughs, and wherein each power terminal is further coupled to a power source.

9. The system of claim 1, wherein a first power source is an RF source and a second power source is an RF source.

10. The system of claim 1, wherein first and second power sources are combinations of RF and DC power sources.

11. The system of claim 1, further comprising:
    a bonding plate coupled between the vacuum plate and the target segments.

12. The system of claim 11, wherein the bonding plate is made of a thermally conductive ceramic material and further wherein the bonding plate is coupled to the vacuum plate and the target segments using a hermetically sealing bonding process.

13. The system of claim 12, wherein the bonding plate is bonded to the vacuum plate using a higher temperature bonding process than the bonding process used to bond the target segments to the bonding plate.

14. The system of claim 11, wherein the bonding plate is thermally conductive.

15. The system of claim 11, wherein the bonding plate is electrically insulating to electrically isolate the vacuum plate from the plurality of target segments.

16. The system of claim 1, wherein the circuit further comprises:
    a DC power supply providing an input to a plurality of RE suppression/DC filter links;
    a plurality of RF suppression/DC filter links providing an input to a first plurality of terminals;
    the first plurality of terminals coupled to the plurality of target segments and further coupled to a plurality of capacitors;
    the plurality of capacitors further coupled to a second plurality of terminals, and at least one of the plurality of capacitors further coupled to each of the plurality of power sources.

17. The system of claim 1, wherein the target further comprises;
- between two and seven target segments, wherein each target segment is a broken ring with a first end terminating near a second end;
- between two and seven linking terminals, each linking terminal coupled to the first end of one of the target segments; and
- between two and seven power terminals, each power terminal coupled to the second end of one of the target segments.

18. The system of claim 1, further comprising an insulating shield bonded to the vacuum plate on a side of the vacuum plate facing the target; and wherein the target is positioned with respect to the vacuum plate and insulating shield to form a free space gap between the target segments and the insulating shield.

19. The system of claim 1, wherein the system further comprises a two-zone, N-segment physical vapor deposition system with $N \geq 2$, wherein:
- the target further comprises;
  - N target segments, wherein the outer M target segments are linked using M linking capacitors to form zone one, the inner n target segments are linked using n linking capacitors to form zone two, wherein M+n=N;
- the plurality of power sources further comprises;
  - a first power source coupled to the zone one target segments, thereby forming a first inductive source when power is applies by the first power source; and
  - a second power source coupled to the zone two target segments, thereby forming a second inductive source when power is applied by the second power source; and
- the circuit further comprises;
  - a DC power supply;
  - N linking terminals;
  - N linking capacitors;
  - N power terminals;
  - N RF suppression/DC filter links receiving input from the DC power supply, each of the N RF suppression/DC filter links coupled to one of the N linking terminals, each of the N linking terminals further coupled to one of the N linking capacitors, a plurality of the linking capacitors of zone 1 further coupled to a plurality of power terminals directly and one of the linking capacitors coupled to the first power source coupled to a power source capacitor coupled to a power terminal, a plurality of the linking capacitors of zone 2 further coupled to a plurality of power terminals directly and one of the linking capacitors of zone 2 coupled to the second power source coupled to a power source capacitor coupled to a power terminal;
- wherein, upon powering the first and second power sources, the combination of the first inductive source and the second inductive source forms an inductively coupled electromagnetic field that increases the ionization of the PVD sputter species.

20. The system of claim 1, wherein the system further comprises a three zone, N-segment physical vapor deposition system, wherein:
- the target further comprises;
  - N target segments, wherein outer M target segments are linked using M linking capacitors to form zone one, middle n target segments are linked using n linking capacitors to form zone two, and inner P target segments are linked using P linking capacitors to form zone three, where M+n+P=N;
- the plurality of power sources further comprises;
  - a first power source coupled to the first zone target segments, thereby forming a first inductive source when power is applied by the first power source; and
  - a second power source coupled to the second zone target segments thereby forming a second inductive source when power is applied by the second power source and
  - a third power source coupled to the third zone target segments, thereby forming a third inductive source when power is applied by the third power source; and
- the circuit further comprises;
  - a DC power supply;
  - N linking terminals;
  - N linking capacitors;
  - N power terminals;
  - N RF suppression/DC filter links receiving input from the DC power supply, each of the N RF suppression/DC filter links couple to one of the N linking terminals, each of the N linking terminals further couple to one of the N linking capacitors, at least one of the linking capacitors of zone 1 further couples to one power terminal directly and the other linking capacitors of zone 1 couples to the first power source that is coupled to a power source capacitor that is further coupled to a power terminal, at least one of the linking capacitors of zone 2 couple to at least one of the power terminals directly and at least one of the linking capacitors of zone 2 couples to the second power source that is coupled to a power source capacitor that is coupled to a power terminal, at least one of the linking capacitors of zone 3 couples to one power terminal directly and the other linking capacitors of zone 3 couple to the third power source that is coupled to at least one power source capacitor that is further coupled to a power terminal;
- wherein, upon powering the first, second, and third power sources, the combination of the first inductive source, the second inductive source, and the third inductive source forms an inductively coupled electromagnetic field that increases the ionization of the PVD sputter species.

21. A segmented-target assembly for use in a physical-vapor deposition system for depositing a material onto a work piece, comprising:
- a plurality of target segments formed from an electrically conductive material;
- a plurality of power sources, each of the power sources coupled to at least one of the plurality of target segments, the plurality of power sources coupled to at least one phase shifter, thereby forming a plurality of inductive sources when power is applied to the plurality of power sources;
- a circuit coupled to the plurality of power sources and further coupled to the target, the circuit operable to transfer power from the plurality of power sources to the target;
- wherein, upon powering the plurality of power sources, the combination of the plurality of inductive source forms an inductively coupled electromagnetic field that increases the ionization of the PVD sputter species.

22. The segmented target assembly of claim 21, wherein the plurality of target segments are broken rings with a first end terminating near a second end.

23. The segmented target assembly of claim 22, further comprising:
- a plurality of linking terminals, each linking terminal coupled to the first end of one of the target segments, each linking terminal further coupled to an RF suppression circuit; and
- a plurality of power terminals, each power terminal coupled to the second end of one of the target segments, each power terminal further coupled to a power source.

24. The segmented target assembly of claim 21, wherein the plurality of target segments are formed from tubing having an approximately circular cross-section, the tubing operable to carry a cooling fluid during target operation to cool the target.

25. The segmented target assembly of claim 21, wherein a first power source is a RF source and a second power source is a RF source.

26. The segmented target assembly of claim 21, further comprising:
- a vacuum plate coupled to the target; and
- a bonding plate coupled between the vacuum plate and the target segments.

27. The segmented target of claim 26, wherein the bonding plate is made of AlN and the vacuum plate is made of stainless steel, and further wherein the bonding plate is coupled to the vacuum plate and the target segments using a hermetically sealing bonding process.

28. The segmented target of claim 27, wherein the bonding plate is bonded to the vacuum plate using a higher temperature bonding process than the bonding process used to bond the target segments to the bonding plate.

29. The segmented target of claim 26, wherein the bonding plate is thermally conductive to transfer heat from the target segments and electrically insulating to electrically isolate the vacuum plate from the plurality of target segments.

30. The segmented target assembly of claim 21, wherein the circuit further comprises:
- a DC power supply providing an input to a plurality of RF suppression/DC filter links;
- a plurality of RF suppression/DC filter links providing an input to a first plurality of terminals;
- the first plurality of terminals coupled to the plurality of target segments and further coupled to a plurality of capacitors;
- a plurality of capacitors further coupled to a second plurality of terminals, and at least one of the plurality of capacitors further coupled to each of the plurality of power sources.

31. The segmented target assembly of claim 21, wherein the target further comprises;
- seven target segments, wherein each target segment is a broken ring with a first end terminating near a second end;
- seven linking terminals, each linking terminal coupled to the first end of one of the target segments; and
- seven power terminals, each power terminal coupled to the second end of one of the target segments.

32. The segmented target assembly of claim 21, wherein the segmented target assembly further comprises a two zone, seven-segment target, wherein:
the target further comprises;
- seven target segments, wherein the outer three target segments are linked using three linking capacitors to form zone one, and the inner four target segments are linked using four linking capacitors to form zone two;

the plurality of power sources further comprises;
- a first power source coupled to the first zone target segments, thereby forming a first inductive source when power is applied by the first power source; and
- a second power source coupled to the second zone target segments, thereby forming a second inductive source when power is applied by the second power source; and the circuit further comprises;
- a DC power supply;
- seven linking terminals;
- seven linking capacitors;
- seven power terminals;
- seven RF suppression/DC filter links receiving input from the DC power supply, each of the seven RF suppression/DC filter links couple to one of the seven linking terminals, each of the seven linking terminals further couple to one of the seven linking capacitors, two of the linking capacitors of zone 1 further couple to two power terminals directly and one of the linking capacitors couples to the first power source coupled to a power source capacitor coupled to a power terminal, three of the linking capacitors of zone 2 further couple to three power terminals directly and one of the linking capacitors of zone 2 couples to the second power source coupled to a power source capacitor coupled to a power terminal;

wherein, upon powering the first and second power sources, the combination of the first inductive source and the second inductive source forms an inductively coupled electromagnetic field that increases the ionization of the PVD sputter species.

33. A method for performing an ionized physical-vapor deposition of a material onto a work piece using a segmented target assembly, comprising:
- forming a target from a plurality of target segments from an electrically conductive material;
- creating a plurality of inductive sources by coupling a plurality of power sources, not to exceed the number of target segments, to the target such that each of the power sources couples to at least one of the plurality of target segments;
- transferring power from the plurality of power sources to the target using a circuit coupled between the plurality of power sources and the target;
- powering the plurality of power sources;
- creating an inductively-coupled electromagnetic field due to the combination of the plurality of inductive sources, that increases the ionization of the PVD sputter species.

34. The method of claim 33, further comprising:
- coupling the plurality of power sources to at least one phase shifter;
- coupling the plurality of target segments to a vacuum plate having a plurality of feedthroughs formed therein;
- positioning a first end of each feedthrough in communication with one of the plurality of target segments; and
- transporting power to the plurality of segments using a terminal coupled to each of the plurality of target segments, each terminal located adjacent to the first end of one of the plurality of feedthroughs.

35. The method of claim 34, further comprising:
- forming the plurality of target segments into broken rings having a first end of each target segment terminating near a second end of that same target segment to create a relatively small gap between the first and second ends of each of the target segments.

36. The method of claim 35, further comprising:

coupling a linking terminal to each first end of the plurality of target segments adjacent to the first end of one of the plurality of feedthroughs;

further coupling the linking terminal to an RF suppression circuit;

coupling a power terminal to each second end of the plurality of target segments adjacent to a second end of one of the plurality of feedthroughs;

providing a power path to the plurality of target segments by coupling each power source to a power terminal.

37. The method of claim 34, further comprising:

electrically isolating the plurality of target segments from the vacuum plate by coupling the plurality of target segments to a first side of a thermally conductive bonding plate and coupling the vacuum plate to a second side of the bonding plate opposite the first side.

38. The method of claim 33, further comprising, controlling the temperature of the target by flowing a coolant through a plurality of cooling channels formed within the vacuum plate.

39. The method of claim 33, wherein coupling a circuit further comprises:

coupling a DC power supply providing to a plurality of RF suppression/DC filter links;

coupling the plurality of RF suppression/DC filter links providing to a first plurality of terminals;

coupling the first plurality of terminals to the plurality of target segments;

coupling the first plurality of terminals to a plurality of capacitors;

coupling the plurality of capacitors to a second plurality of terminals such that at least one of the plurality of capacitors further couples to each of the plurality of power sources.

40. The method of claim 33, wherein;

forming a target further comprises forming a target from seven target segments and linking the outer three target segments linked using three capacitors to form zone one and linking the inner four target segments linked using four capacitors to form zone two;

creating a plurality of inductive sources further comprises coupling a first power source; to the zone one target segments, thereby forming a first inductive source when power is applied by the first power source and coupling a second power source to the zone two target segments, thereby forming a second inductive source when power is applied by the second power source; and transferring power further comprises coupling a DC power supply to seven RF suppression/DC filter links, coupling each of the seven RF suppression/DC filter links coupled to seven linking terminals, coupling the seven linking terminals to seven linking capacitors such that two of the linking capacitors of zone 1 further couple to two power terminals directly and one of the linking capacitors couples to the first power source coupled to a power source capacitor coupled to a power terminal and three of the linking capacitors of zone 2 further couple to three power terminals directly and one of the linking capacitors of zone 2 couples to the second power source coupled to a power source capacitor coupled to a power terminal;

forming an inductively coupled electromagnetic field by powering the first and second power sources that increases the ionization of the PVD sputter species.

* * * * *

UNITED STATES PATENT AND TRADEMARK OFFICE
CERTIFICATE OF CORRECTION

PATENT NO.    : 6,488,822 B1
DATED         : December 3, 2002
INVENTOR(S)   : Mehrdad M. Moslehi It is certified that error appears in the above-identified patent and that said Letters Patent is hereby corrected as shown below:

<u>Title page,</u>
Item [73], Assignee, delete "Veecoleve, Inc." and replace with -- Veeco/CVC, Inc. --

Signed and Sealed this

Twentieth Day of May, 2003

JAMES E. ROGAN
*Director of the United States Patent and Trademark Office*